United States Patent
Sun

(10) Patent No.: US 9,761,833 B2
(45) Date of Patent: Sep. 12, 2017

(54) PACKAGING METHOD WITH FILMS, FILM PACKAGE STRUCTURE AND DISPLAY DEVICE

(71) Applicant: BOE TECHNOLOGY GROUP CO., LTD., Beijing (CN)

(72) Inventor: Wenwen Sun, Beijing (CN)

(73) Assignee: BOE TECHNOLOGY GROUP CO., LTD. (CN)

(*) Notice: Subject to any disclaimer, the term of this patent is extended or adjusted under 35 U.S.C. 154(b) by 0 days.

(21) Appl. No.: 14/908,395

(22) PCT Filed: Jul. 23, 2015

(86) PCT No.: PCT/CN2015/084865
§ 371 (c)(1),
(2) Date: Jan. 28, 2016

(87) PCT Pub. No.: WO2016/141663
PCT Pub. Date: Sep. 15, 2016

(65) Prior Publication Data
US 2017/0047543 A1 Feb. 16, 2017

(30) Foreign Application Priority Data
Mar. 10, 2015 (CN) .......................... 2015 1 0104413

(51) Int. Cl.
*H01L 51/52* (2006.01)
*C23C 16/50* (2006.01)
(Continued)

(52) U.S. Cl.
CPC ........ *H01L 51/5253* (2013.01); *C23C 16/042* (2013.01); *C23C 16/345* (2013.01);
(Continued)

(58) Field of Classification Search
None
See application file for complete search history.

(56) References Cited

U.S. PATENT DOCUMENTS 8,039,739 B1* 10/2011 Capps ................... H01L 31/048
136/251
2004/0145311 A1* 7/2004 Su ....................... H01L 51/5253
313/512
(Continued)

FOREIGN PATENT DOCUMENTS

CN        101697343        4/2010
CN        102299118        5/2011
(Continued)

OTHER PUBLICATIONS

Wuu, D.S., W.C. Lo, C.C. Chiang, H.B. Lin, L.S. Chang, R.H. Horng, C.I. Huang, and Y.J. Gao. "Plasma-deposited Silicon Oxide Barrier Films on Polyethersulfone Substrates: Temperature and Thickness Effects." Surface and Coatings Technology 197.2-3 (2005): 253-59.*

(Continued)

*Primary Examiner* — Joseph Schoenholtz
(74) *Attorney, Agent, or Firm* — Brooks Kushman P.C.

(57) ABSTRACT

The present disclosure provides a packaging method with films, a film package structure and a display device, which can effectively prevent water and oxygen from invading into a display unit and improve the bending resistance of the display unit. The method comprises: step 1, placing an device to be packaged in a PECVD device, and setting a mask plate to expose a packaging region of the device and mask a region of the device that does not need to be packaged; step 2, adjusting a gas that is passed into the PECVD device, and depositing a layer of inorganic silicon material film; step 3, adjusting $N_2$ gas that is passed into the PECVD device, and depositing a layer of organosilane film (Continued)

on the layer of the inorganic silicon material film using an organic material that reacts with the inorganic silicon material.

15 Claims, 1 Drawing Sheet

(51) Int. Cl.
*C23C 16/40* (2006.01)
*C23C 16/34* (2006.01)
*C23C 16/04* (2006.01)
*H01L 51/56* (2006.01)

(52) U.S. Cl.
CPC ............ *C23C 16/401* (2013.01); *C23C 16/50* (2013.01); *H01L 51/5256* (2013.01); *H01L 51/56* (2013.01)

(56) References Cited

U.S. PATENT DOCUMENTS

| | | | |
|---|---|---|---|
| 2004/0229051 A1 | 11/2004 | Schaepkens et al. | |
| 2005/0271809 A1* | 12/2005 | Kobrin | B82Y 30/00 427/248.1 |
| 2007/0210702 A1* | 9/2007 | Nakamura | H01L 51/0024 313/504 |
| 2009/0110892 A1 | 4/2009 | Erlat et al. | |
| 2009/0110917 A1* | 4/2009 | Albaugh | H01L 23/296 428/336 |
| 2010/0178481 A1* | 7/2010 | George | C23C 16/402 428/213 |
| 2011/0097533 A1* | 4/2011 | Li | C23C 16/029 428/68 |
| 2013/0012087 A1* | 1/2013 | Itoh | C08J 5/24 442/71 |
| 2014/0065739 A1* | 3/2014 | Chen | H01L 51/5253 438/26 |
| 2014/0307030 A1* | 10/2014 | Uchiyama | B41J 2/14233 347/47 |
| 2016/0035999 A1* | 2/2016 | Ii | H01L 51/5253 257/40 |
| 2016/0343988 A1* | 11/2016 | Meyer | H01L 51/5256 |

FOREIGN PATENT DOCUMENTS

| | | |
|---|---|---|
| CN | 103762321 | 4/2014 |
| CN | 104136657 | 11/2014 |
| CN | 104201295 | 12/2014 |
| CN | 104300005 | 1/2015 |
| CN | 104733647 A | 6/2015 |

OTHER PUBLICATIONS

Kelkar, Sanket S., David Chiavetta, and Colin A. Wolden. "Formation of Octadecyltrichlorosilane (OTS) Self-assembled Monolayers on Amorphous Alumina." Applied Surface Science 282 (2013): 291-96.*
Onclin, S., Ravoo, B. J. and Reinhoudt, D. N. (2005), Engineering Silicon Oxide Surfaces Using Self-Assembled Monolayers. Angewandte Chemie International Edition, 44: 6282-6304.*
Sung, M., et. al., "Formation of Alkylsiloxane self-assembled monolyaers on Si3N4", J. Vac. Sci. Technol. A 17(2) Mar./Apr. 1999 pp. 540-544.*
Chinese Office Action dated Nov. 18, 2015.
Chinese Office Action dated Mar. 11, 2016.
Written Opinion and International Search Report dated Mar. 10, 2015.

* cited by examiner

PACKAGING METHOD WITH FILMS, FILM PACKAGE STRUCTURE AND DISPLAY DEVICE

CROSS-REFERENCE TO RELATED APPLICATION

The present application is the U.S. national phase of PCT Application No. PCT/CN2015/084865 filed on Jul. 23, 2015, which claims priority to the Chinese patent application No. 201510104413.9 filed in China on Mar. 10, 2015, the entire contents of which is incorporated by reference.

TECHNICAL FIELD

The present disclosure relates to the field of package structures and packaging methods, and in particular to a packaging method with films, a film package structure and a display device.

BACKGROUND

It is shown by a research that, components in the air, such as aqueous vapor and oxygen, etc., have a great influence on the life time of an OLED. The main reasons lie in the following two aspects: the metal that functions as the cathode, for example, silver, aluminium and magnesium, is generally active, and it tends to react with the aqueous vapor, oxygen and the like that penetrate thereinto, thus the cathode work function of the cathode of an OLED device will be influenced; and the aqueous vapor, oxygen and the like that penetrate thereinto will further react with the hole transport layer and the electron transport layer, thus it may cause the device to fail. Therefore, in order to prevent the aging and unstability of an organic photoelectric device, an OLED device needs to be packaged effectively.

With the rising of flexible OLEDs, a packaging technology for flexible OLEDs is put forward correspondingly. On one hand, the packaging technology requires that, for the package structure, the aqueous vapor permeability should be at least lower than $5 \times 10^{-5}$ g/m² d, and the oxygen permeability should be lower than $10^{-5}$ cm²/m² d; on the other hand, it also requires that the package structure has flexibility and bendability, thus the traditional rigid package structure cannot meet the requirements.

At present, novel package materials and package structures represented by film package structures come into existence. The existing film package structure includes a film such as inorganic insulating film of $SiO_x$ or $SiN_x$, etc. Although an inorganic insulating film has high water and oxygen resistance, the film surface thereof is rough and has "apertures", so that ambient water and oxygen tend to invade thereinto via the "apertures", thus the water and oxygen resistance of the film package structure is lowered. Moreover, the existing film package structure consists of organic films and inorganic insulating films that are physically set alternately. Since the two kinds of layers are connected physically, interlayer detachment or breakage may occur after the film package structure is bended for several times, and thus the flexible display device will be damaged devastatingly, or the service life of the display device will be influenced.

Therefore, it is an important topic for those skilled in the art that there needs to provide a display device, which can effectively prevent water and oxygen invasion, and a film package structure, which can improve the bending resistance of the film package structure.

SUMMARY

The present disclosure provides a packaging method with films, a film package structure and a display device, which can effectively prevent water and oxygen from invading into a display device and improve the bending resistance of a display device.

To attain the above objects, the disclosure provides the following technical solutions:

According to an embodiment of the disclosure, there provides a packaging method with films, which comprises:

step 1, placing an device to be packaged in a plasma-enhanced chemical vapor deposition (PECVD) device, and setting a mask plate to expose a packaging region of the device to be packaged and mask a region of the device to be packaged that does not need to be packaged;

step 2, adjusting a gas that is passed into the plasma-enhanced chemical vapor deposition device, and depositing a layer of inorganic silicon material film; and step 3, adjusting $N_2$ gas that is passed into the plasma-enhanced chemical vapor deposition device, and depositing a layer of organosilane film on the layer of the inorganic silicon material film using an organic material that reacts with the inorganic silicon material.

According to another embodiment of the disclosure, the step 2) of the above method comprises:

adjusting $SiH_4$ and $N_2O$ gases that are passed into the plasma-enhanced chemical vapor deposition device, and depositing and growing a layer of inorganic $SiO_x$ film; or adjusting $SiH_4$ and $NH_3$ gases that are passed into the plasma-enhanced chemical vapor deposition device, and depositing and growing a layer of inorganic $SiN_x$ film.

According to another embodiment of the disclosure, the $SiH_4$ gas is diluted by helium gas or argon gas so that its volume concentration is in the range of 5% to 30%.

According to another embodiment of the disclosure, the step 3) comprises: adjusting $N_2$ gas that is passed into the plasma-enhanced chemical vapor deposition device, and depositing the layer of the organosilane film on the layer of the inorganic silicon material film using a chlorine atom-containing organic aliphatic silane that reacts with the inorganic silicon material.

According to another embodiment of the disclosure, the method further includes a step 4): repeating steps 2) and 3).

According to another embodiment of the disclosure, after the step 4), the method further includes a step 5):

adjusting $O_2$ gas that is passed into the plasma-enhanced chemical vapor deposition device, and depositing a layer of hexamethyldisiloxane film on the layer of the organosilane film using an organosilicon precursor.

According to another embodiment of the disclosure, the method comprises:

repeating steps 2), 3) and 5); or repeating steps 2) and 3) several times, and then performing step 5).

According to an embodiment of the disclosure, there provides a film package structure, which consists of at least one layer of inorganic silicon material films and at least one layer of organosilane films that are set alternately, wherein the organosilane film is bonded with the inorganic silicon material film via chemical bonds.

According to another embodiment of the disclosure, the inorganic silicon material is selected from $SiO_x$, $SiN_x$ or a combination thereof.

According to still another embodiment of the disclosure, the organic material for forming the organosilane film is a chlorine atom-containing organic aliphatic silane.

According to still another embodiment of the disclosure, the chlorine atom-containing organic aliphatic silane is one selected from octadecyltrichlorosilane, eicosyltrichlorosilane, tetradecyltrichlorosilane and hexadecyltrichlorosilane.

According to still another embodiment of the disclosure, a thickness of a layer of the inorganic silicon material films is in the range of 20 to 2000 nm, and the number of layers of the inorganic silicon material films is in the range of 1 to 10.

According to still another embodiment of the disclosure, a thickness of a layer of organosilane film is in the range of 100 to 2000 nm, and the number of layers of the organosilane films is in the range of 1 to 10.

According to still another embodiment of the disclosure, a layer of hexamethyldisiloxane film is further deposited on the layer of the organosilane film.

According to still another embodiment of the disclosure, a thickness of a layer of hexamethyldisiloxane film is in the range of 100 to 2000 nm, and the number of layers of the hexamethyldisiloxane film is in the range of 1 to 8.

According to an embodiment of the disclosure, there provides a display device, which comprises any one of the above film package structures.

The disclosure provides a packaging method with films, a film package structure and a display device. In the packaging method with films, the organic material may react with the inorganic silicon material, that has absorbed water, on the surface of the inorganic silicon material so that the organic film may be well bonded with the surface of the inorganic silicon film; and the organic film functions as restoring the surface of the inorganic silicon film, and the defect of "apertures" on the surface of the inorganic silicon film may be reduced, so that the path by which water and oxygen invade into the display device may be reduced. Additionally, since the organic film and the inorganic silicon film are bonded via chemical bonds rather than via ordinary physical attachment, so that the bending resistance of the packaging structure according to the disclosure will be stronger. Further, for the packaging method according to the disclosure, the technological operation is simple, thus it is applicable for a large-scale production.

Figure 1:
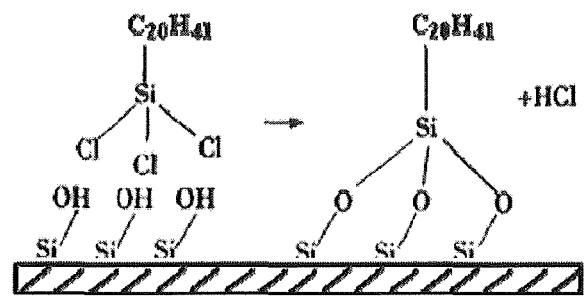
FIG. 1 is a schematic diagram showing a mechanism by which an organic material chemically modifies the surface of an inorganic silicon material according to an embodiment of the disclosure.

Wherein,  represents an inorganic silicon material or an inorganic silicon material film;  represents an organic material or an organic material film;  represents hexamethyl disiloxane or a hexamethyl disiloxane film.

DETAILED DESCRIPTION OF EMBODIMENTS

The technical solutions in the embodiments of the disclosure will be described clearly and fully below in conjunction with the drawings of the disclosure. Apparently, the embodiments described are only a part of the embodiments of the disclosure, rather than being the whole embodiments. All other embodiments obtained by a person skilled in the art based on the embodiments of the disclosure without creative work pertain to the protection scope of the disclosure.

A packaging method with films, a film package structure and a display device according to an embodiment of the disclosure will be described in detail below in conjunction with the drawings.

An embodiment of the disclosure provides a packaging method with films, which includes:

step 1, placing an device to be packaged in a plasma-enhanced chemical vapor deposition device, and setting a mask plate to expose a packaging region of the device to be packaged and mask a region of the device to be packaged that does not need to be packaged;

step 2, adjusting a gas that is passed into the plasma-enhanced chemical vapor deposition device, and depositing a layer of an inorganic silicon material film; and step 3, adjusting $N_2$ gas that is passed into the plasma-enhanced chemical vapor deposition device, and depositing a layer of an organosilane film on the layer of the inorganic silicon material film using an organic material that reacts with the inorganic silicon material.

In the above method according to the disclosure, the organic material may react with the inorganic silicon material, that has absorbed water, on the surface of the inorganic silicon material so that the organic film may be well bonded with the surface of the inorganic silicon film; and the organic film functions as restoring the surface of the inorganic silicon film, and the defect of "apertures" on the surface of the inorganic silicon film may be reduced, so that the path by which water and oxygen invade into the apparatus may be reduced. In addition, since the organic film is bonded with the inorganic silicon film via chemical bonds rather than via ordinary physical attachment, the bending resistance of the package structure according to the disclosure will be stronger. For the packaging method according to the disclosure, the technological operation is simple, thus it is applicable for a large scale production.

In an embodiment of the disclosure, the step 2) includes: adjusting $SiH_4$ and $N_2O$ gases that are passed into the plasma-enhanced chemical vapor deposition device, and depositing and growing a layer of an inorganic $SiO_x$ film; or adjusting $SiH_4$ and $NH_3$ gases that are passed into the plasma-enhanced chemical vapor deposition device, and depositing and growing a layer of inorganic $SiN_x$ film.

In the above embodiment, an inorganic silicon film may be formed on a substrate by both of the above methods. The inorganic silicon film may specifically be an inorganic $SiO_x$ film and an inorganic $SiN_x$ film, which may be obtained by respectively adjusting the ratio of $SiH_4$ to $N_2O$ and the ratio of $SiH_4$ to $NH_3$, which are passed into the plasma-enhanced chemical vapor deposition device. At this time, a nitrogen-enriched atmosphere exists in the whole plasma-enhanced chemical vapor deposition device, and an inorganic silicon film may be deposited via a plasma-enhanced chemical vapor deposition method.

In another embodiment of the disclosure, the $SiH_4$ gas is diluted by helium gas or argon gas so that its volume concentration is in the range of 5% to 30%. In this embodiment, before depositing the above inorganic silicon film, the concentration of the gas $SiH_4$ passed thereinto needs to be diluted, so that the gas $SiH_4$ can react sufficiently with $N_2O$ or $NH_3$, thus the inorganic silicon film formed will have good characteristics. In another embodiment of the disclosure, the gas $SiH_4$ is diluted so that its volume concentration is about 10%. At this concentration, it not only can react sufficiently with $N_2O$ or $NH_3$, but also can avoid the waste of gas $SiH_4$. It should be understood that, a person skilled in the art may adjust the volume concentration of the gas $SiH_4$ in the above range according to practical situation during production.

In another embodiment of the disclosure, the step 3) specifically includes: adjusting $N_2$ gas that is passed into the plasma-enhanced chemical vapor deposition device, and depositing a layer of an organosilane film on the layer of the inorganic silicon material film using a chlorine atom-containing organic aliphatic silane that reacts with the inorganic silicon material.

In another embodiment of the disclosure, the method further includes a step 4): repeating steps 2) and 3). In this embodiment, for the package structure consisting of multiple inorganic silicon films and organosilane films that are set alternately by repeating steps 2) and 3) several times, the defect of "apertures" on the surface of the inorganic silicon film may be reduced more effectively, and the bending resistance of the package structure may be improved.

In one embodiment of the disclosure, after the step 4), the method further includes a step 5): adjusting $O_2$ gas that is passed into the plasma-enhanced chemical vapor deposition device, and depositing a layer of hexamethyldisiloxane film on the layer of the organic silane film via an organosilicon precursor.

In this embodiment, after the inorganic silicon material film and the organosilane film are deposited in turn in a plasma-enhanced chemical vapor deposition device, the ratio of $O_2$ that is passed into the plasma-enhanced chemical vapor deposition device may be further adjusted, and the hexamethyldisiloxane film may be deposited via an organosilicon precursor so as to release a stress of the organic film, thereby the bending resistance of the film package structure may be improved. In the above technical solution, the organosilicon precursor is an organosiloxane compound that can be cleaved in the plasma environment, and it may be selected from tetraethoxysilane, hexamethyldioxysilane, octamethylcyclotetrasiloxane or tetramethylcyclotetrasiloxane, etc.

In one embodiment of the disclosure, the method specifically comprises: repeating steps 2), 3) and 5); or repeating steps 2) and 3) several times, and then performing step 5).

In this embodiment, there provides two types of film package structures that include a hexamethyldisiloxane film type 1, an inorganic silicon film, an organosilane film and a hexamethyldisiloxane film are in turn deposited repeatedly; type 2, a hexamethyldisiloxane film is deposited after an inorganic silicon film and an organosilane film are in turn deposited repeatedly for several times. However, it should be understood by a person skilled in the art that, the film package structure that includes a hexamethyldisiloxane film is not limited to the above structure, and it further includes reasonable modification of the above structure made by a person skilled in the art. For example, after an inorganic silicon film, an organosilane film and a hexamethyldisiloxane film are in turn deposited repeatedly for several times, an inorganic silicon film and an organosilane film are deposited repeatedly, and then an inorganic silicon film, an organosilane film and a hexamethyldisiloxane film are in turn deposited repeatedly, so long as the reasonable structures within the above scope fall into the protection scope of the disclosure.

Figure 2:
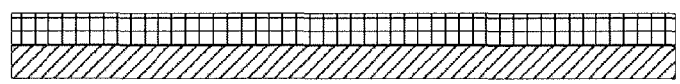
FIG. 2 is a schematic diagram of a film package structure according to one embodiment of the disclosure.

FIG. 2 shows a schematic diagram of a film package structure according to one embodiment of the disclosure.

One embodiment of the disclosure provides a film package structure, which consists of at least one inorganic silicon material film and at least one organosilane film that are set alternately, wherein the organosilane film is bonded with the inorganic silicon material film via chemical bonds.

The disclosure provides a film package structure, wherein an organic material is well bonded via chemical bonds with the surface of an inorganic silicon material that has absorbed water, and the defect of "apertures" on the surface of the inorganic silicon film may be reduced, so that the path by which water and oxygen invade into the device may be reduced. In addition, since the organic film is bonded with the inorganic silicon film via chemical bonds rather than by ordinary physical attachment, the bending resistance of the packaging structure according to the disclosure will be stronger.

In one embodiment of the disclosure, the inorganic silicon material is selected from $SiO_x$, $SiN_x$ or a combination thereof. In one embodiment of the disclosure, the organic material for forming the organosilane film is a chlorine atom-containing organic aliphatic silane. In this embodiment, the requirement that the organic aliphatic silane contains chlorine atoms lies in that the chlorine atoms are bonded with the hydrogen in the alcoholic hydroxyl groups in the inorganic silicon material that has absorbed water, so that the organic material may be better bonded with the inorganic silicon material, thereby the organosilane film may be well bonded with the inorganic silicon film (reference may be made to FIG. 1 for the chemical modification mechanism of an organic material to an inorganic silicon material). The chlorine atom-containing organic aliphatic silane may be selected from octadecyltrichlorosilane, eicosyltrichlorosilane, tetradecyltrichlorosilane and hexadecyltrichlorosilane, etc. Here, it should be noted that, the chlorine atom-containing organic aliphatic silane in this embodiment may also be a chlorine atom-containing organic aromatic silane, but the chemical bonding action thereof is not as strong as that of an aliphatic silane. It may be understood that, the chlorine atom-containing organic aliphatic silane is not limited to the above examples. Instead, it may also be other organic aliphatic silane that is regarded as reasonable in the art.

In one embodiment of the disclosure, a thickness of a layer of the inorganic silicon material film is in the range of 20 to 2000 nm, and the number of layers of the inorganic silicon material films is in the range of 1 to 10. In another embodiment of the disclosure, the thickness of a layer of the organosilane film is in the range of 100 to 2000 nm, and the number of layers of the organosilane films is in the range of 1 to 10.

In the above embodiment, when the inorganic silicon material film and the organosilane film are repeated, this double-layer structure may be repeated for 1-10 times, and preferably, 2-5 times. It should be noted that it is not true that, the thicker the double-layer structure is, the better it will be; instead, it should be considered comprehensively according to the chemical bonding firmness and the physical bending characteristic of the film package structure formed finally. In the above embodiment, the thickness of the organosilane film is preferably in the range of 500 to 2000 nm, so that excellent bendability and water and oxygen resistance can be achieved.

In one embodiment of the disclosure, a hexamethyldisiloxane film is further deposited on the organosilane film. In one embodiment of the disclosure, the thickness of a layer of the hexamethyldisiloxane film is in the range of 100 to 2000 nm, and the number of layers of the hexamethyldisiloxane films is in the range of 1 to 8. It may be understood that, the purpose of depositing a hexamethyldisiloxane film on the organosilane film is to assist the above package structure in further improving the water and oxygen resistance. Therefore, any organic film may be applicable to the disclosure, so long as the technical effect can be achieved and no other reactions occur with the organosilane film.

In the above embodiment, when an inorganic silicon film, an organosilane film and a hexamethyldisiloxane film are in turn deposited repeatedly or when a hexamethyldisiloxane film is deposited after an inorganic silicon film and an organosilane film are in turn deposited repeatedly, the package structure may be repeated for 1-8 times, and preferably, 2-3 times.

One embodiment of the disclosure provides a display device, which includes any one of the above film package structures.

The disclosure provides a display device, which includes the film package structure according to the above embodiments. Since the organic material in the film package structure may be well bonded, via chemical bonding, with the surface of an inorganic silicon material that has absorbed water, and the defect of "apertures" on the surface of the inorganic silicon film may be reduced, the path by which water and oxygen invade into the apparatus may be reduced. Additionally, since the organic film is bonded with the inorganic silicon film via chemical bonds rather than by ordinary physical attachment, the bending resistance of the package structure according to the disclosure will be stronger, so that the display device finally formed has a better packaging effect.

The packaging method with films, the film package structure and the display device according to the embodiments of the disclosure will be further illustrated in detail below in conjunction with specific embodiments.

Embodiment 1

Figure 3:
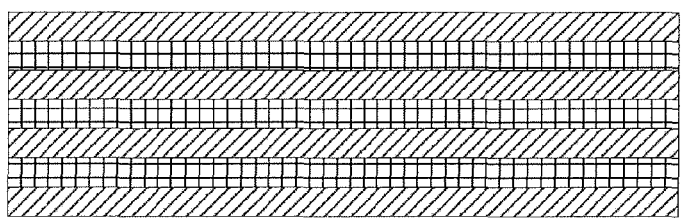
FIG. 3 is a schematic diagram of a film package structure according to Embodiments 1-3 of the disclosure.

A package structure 1 of Embodiment 1 is prepared according to the steps below:

1) placing an device to be packaged, which includes a substrate, an array substrate and an organic electro-element, in a plasma-enhanced chemical vapor deposition device (model ND200), and setting a mask plate made of Fe—Ni alloy to expose the packaging region of the device to be packaged and mask the region of the device to be packaged that does not need to be packaged;

2) adjusting gases $SiH_4$ (diluted to have a volume concentration of 10% by He) and $N_2O$ that are passed into the plasma-enhanced chemical vapor deposition device, and depositing and growing a layer of inorganic $SiO_x$ film, wherein the flow rate of $SiH_4$ is 200 cm$^3$/min, and the flow rate of $N_2O$ is 800 cm$^3$/min. The deposition parameters of the plasma-enhanced chemical vapor deposition device are as follows: power: 300 W; temperature: 200° C.; pressure: 106 Pa; deposition time: 80 s. The thickness of the $SiO_x$ film deposited is about 1000 nm, as measured by Inom ellipsometer;

3) adjusting gas $N_2$ that is passed into the plasma-enhanced chemical vapor deposition device so that the flow rate of $N_2$ is about 100 cm$^3$/min, depositing a layer of eicosyltrichlorosilane film via eicosyltrichlorosilane. The thickness of the film deposited is about 100 nm, as measured by mom ellipsometer;

4) alternately repeating steps (2), (3) for 4 times and 3 time respectively, and obtaining a film package structure 1, as shown in FIG. 3.

Embodiment 2

A package structure 2 of Embodiment 2 is prepared according to the same steps as Embodiment 1, except that the thickness of the eicosyltrisilane film deposited is about 1000 nm, as shown in FIG. 3.

Embodiment 3

A package structure 3 of Embodiment 3 is prepared according to the steps below:

1) placing an device to be packaged, which includes a substrate, an array substrate and an organic electro-element, in a plasma-enhanced chemical vapor deposition device (model ND200), and setting a mask plate made of Fe—Ni alloy to expose the packaging region of the device to be packaged and mask the region of the device to be packaged that does not need to be packaged;

2) adjusting gases $SiH_4$ (diluted to have a volume concentration of 10% by He) and $NH_3$ that are passed into the plasma-enhanced chemical vapor deposition device, and depositing and growing a layer of inorganic $SiN_x$ film, wherein the flow rate of $SiH_4$ is 500 cm$^3$/min, and the flow rate of $NH_3$ is 250 cm$^3$/min. The deposition parameters of the plasma-enhanced chemical vapor deposition device are as follows: power: 700 W; temperature: 200° C.; pressure: 106 Pa; deposition time: 100 s; the thickness of the layer of $SiN_x$ film deposited is about 1000 nm, as measured by mom ellipsometer;

3) adjusting gas $N_2$ that is passed into the plasma-enhanced chemical vapor deposition device, and depositing an eicosyltrisilane film via eicosyltrichlorosilane; thickness of the layer of the film grown is about 1000 nm, as measured by Inom ellipsometer;

4) alternately repeating steps (2), (3) for 4 times and 3 times respectively, and obtaining a film package structure 3, as shown in FIG. 3.

Embodiment 4

Figure 4:
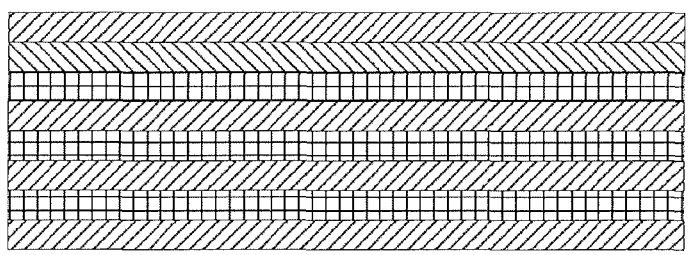
FIG. 4 is a schematic diagram of a film package structure according to Embodiment 4 of the disclosure.

A package structure 4 according to Embodiment 4 is prepared according to the steps below:

1) placing an device to be packaged, which includes a substrate, an array substrate and an organic electro-element, in a plasma-enhanced chemical vapor deposition device (model ND200), and setting a mask plate made of Fe—Ni alloy to expose the packaging region of the device to be packaged and mask the region of the device to be packaged that does not need to be packaged;

2) adjusting gases $SiH_4$ (diluted to have a volume concentration of 10% by Ar) and $N_2O$ that are passed into the plasma-enhanced chemical vapor deposition device, and depositing and growing a layer of inorganic $SiO_x$ film, wherein the flow rate of $SiH_4$ is cm$^3$/min, and the flow rate of $N_2O$ is 800 cm$^3$/min. The deposition parameters of the plasma-enhanced chemical vapor deposition device are as follows: power: 300 W; temperature: 200° C.; pressure: 106 Pa; deposition time 65 s; and the thickness of the $SiO_x$ film deposited is about 800 nm, as measured by mom ellipsometer;

3) adjusting gas $N_2$ that is passed into the plasma-enhanced chemical vapor deposition device so that its flow rate is 100 cm$^3$/min, and depositing a layer of eicosyltrisilane film via eicosyltrichlorosilane, wherein the thickness of the film deposited is about 1000 nm, as measured by Inom ellipsometer;

4) adjusting gas $O_2$ that is passed into the plasma-enhanced chemical vapor deposition device so that its flow rate is 100 cm$^3$/min, and depositing a layer of hexamethyldisiloxane film via an organosilicon precursor, wherein thickness of the layer of the film deposited is about 500 nm, as measured by mom ellipsometer;

5) alternately repeating steps (2), (3) for 3 times respectively, and then performing step (4) and obtaining a film package structure 4, as shown in FIG. 4.

Embodiment 5

Figure 5:
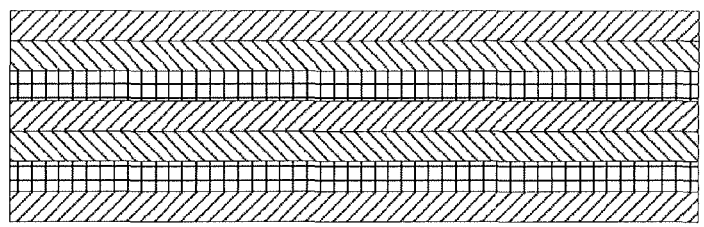
FIG. 5 is a schematic diagram of a film package structure according to Embodiment 5 of the disclosure.

A package structure 5 according to Embodiment 1 is prepared according to the steps below:

1) placing an device to be packaged, which includes a substrate, an array substrate and an organic electro-element, in a plasma-enhanced chemical vapor deposition device (model ND200), and setting a mask plate made of Fe—Ni alloy to expose the packaging region of the device to be packaged and mask the region of the device to be packaged that does not need to be packaged;

2) adjusting gases $SiH_4$ (diluted to have a volume concentration of 10% by Ar) and $N_2O$ that are passed into the plasma-enhanced chemical vapor deposition device, and depositing and growing a layer of inorganic $SiO_x$ film, wherein the flow rate of $SiH_4$ is 200 cm$^3$/min, and the flow rate of $N_2O$ is 800 cm$^3$/min. The deposition parameters of the plasma-enhanced chemical vapor deposition device are as follows: power: 300 W; temperature: 200° C.; pressure: 106 Pa; deposition time: 80 s; and thickness of the layer of the $SiO_x$ film deposited is about 1000 nm, as measured by Inom ellipsometer;

3) adjusting gas $N_2$ that is passed into the plasma-enhanced chemical vapor deposition device so that its flow rate is 100 cm$^3$/min, and depositing a layer of eicosyltrisilane film via eicosyltrichlorosilane, wherein thickness of the layer of the film deposited is about 2000 nm as measured by mom ellipsometer;

4) adjusting gas $O_2$ that is passed into the plasma-enhanced chemical vapor deposition device, and depositing a hexamethyldisiloxane film via an organosilicon precursor, wherein the thickness of the film deposited is about 1000 nm, as measured by mom ellipsometer;

5) repeating in turn steps (2), (3) and (4) twice respectively, and obtaining a film package structure 5, as shown in FIG. 5.

Comparative Embodiment 1

A package structure of Comparative Example 1 is prepared according to the steps below:

1) placing an device to be packaged, which includes a substrate, an array substrate and an organic electro-element, in a plasma-enhanced chemical vapor deposition device (model ND200), and setting a mask plate made of Fe—Ni alloy to expose the packaging region of the device to be packaged and mask the region of the device to be packaged that does not need to be packaged;

2) adjusting gases $SiH_4$ (diluted to have a volume concentration of 10% by He) and $N_2O$ that are passed into the plasma-enhanced chemical vapor deposition device, and depositing and growing a layer of inorganic $SiO_x$ film, wherein the flow rate of $SiH_4$ is 200 cm$^3$/min, and the flow rate of $N_2O$ is 800 cm$^3$/min. The deposition parameters of the plasma-enhanced chemical vapor deposition device are as follows: power: 300 W; temperature: 200° C.; pressure: 106 Pa; deposition time: 80 s. The thickness of the $SiO_x$ film deposited is about 1000 nm, as measured by mom ellipsometer;

3) adjusting gases $SiH_4$ (diluted to have a volume concentration of 10% by He) and $NH_3$ that are passed into the plasma-enhanced chemical vapor deposition device, and depositing and growing a layer of inorganic $SiN_x$ film, wherein the flow rate of $SiH_4$ is 500 cm$^3$/min, and the flow rate of $NH_3$ is 250 cm$^3$/min. The deposition parameters of the plasma-enhanced chemical vapor deposition device are as follows: power: 700 W; temperature: 200° C.; pressure: 106 Pa; deposition time: 100 s. The thickness of the $SiN_x$ film deposited is about 1000 mm, as measured by mom ellipsometer;

4) alternately repeating steps (2), (3) for 4 times and 3 times respectively, and obtaining the film package structure of the Comparative Example.

Performance Test

The following test is performed on the film package structures 1-5 obtained in the above Embodiments 1-5 and the comparative film package structure obtained in the Comparative embodiment 1. See Table 1 for the specific result.

1) After being placed in a high-temperature and high-humidity environment (60° C., 90%) and stored for 700 hours a) The water vapour permeability of each film package structure is tested by USA MOCON oxygen-permeability tester;

b) The package effect of each film package structure is observed with naked eyes.

2) The bending resistance result is observed with naked eyes after bending the film package structure in each embodiment for 10000 times.

TABLE 1

Test Results Of The Film package Structures Provided By The Above Embodiments 1-5 And Comparative Embodiment 1

| | Tem. (° C.) | Humidity | Test Time (h) | Water Vapour Permeability (WVTR) | Packaging Effect | Bending resistance (10000 times @20 mm) |
|---|---|---|---|---|---|---|
| Em. 1 | 60 | 90% | 700 | WVTR ≤ $10^{-5}$ | No Black Corner, No Black Spot | No Abnormity |
| Em. 2 | 60 | 90% | 700 | WVTR ≤ $10^{-6}$ | No Black Corner, No Black Spot | No Abnormity |
| Em. 3 | 60 | 90% | 700 | WVTR ≤ $10^{-5}$ | No Black Corner, No Black Spot | No Abnormity |
| Em. 4 | 60 | 90% | 700 | WVTR ≤ $10^{-5}$ | No Black Corner, No Black Spot | No Abnormity |

TABLE 1-continued

Test Results Of The Film package Structures Provided By
The Above Embodiments 1-5 And Comparative Embodiment 1

| | Tem. (° C.) | Humidity | Test Time (h) | Water Vapour Permeability (WVTR) | Packaging Effect | Bending resistance (10000 times @20 mm) |
|---|---|---|---|---|---|---|
| Em. 5 | 60 | 90% | 700 | WVTR ≤ $10^{-5}$ | No Black Corner, No Black Spot | No Abnormity |
| CE. 1 | 60 | 90% | 700 | WVTR ≥ $10^{-4}$ | Black corner occurs at the bottom right and the bottom left of the panel; many large black spots are distributed on the panel | Cracks occur macroscopically |

It may be known from the results of Table 1 that: for the film package structure provided by the Comparative embodiment, not only it is unqualified in the aspects of water vapour permeability and packaging effect, but also cracks occur macroscopically after being bended for many times; however, for the film package structure provided by the embodiments of the disclosure, since the organic material is well bonded, via chemical bonds, with the surface of an inorganic silicon material that has absorbed water, the defect of "apertures" on the surface of the inorganic silicon film may be reduced, and thus it functions as well restoring the surface of the inorganic silicon film, so that the ambient water vapour permeability meets the requirement of the package structure on water vapour permeability, which is ≤$10^{-5}$; moreover, since the two are well bonded, the film package structure has stronger bending resistance, and no abnormity occurs after being bended for 10000 times, thereby the overall packaging effect may be improved.

Apparently, the above embodiments are only used for clearly illustrating the examples, rather than limiting the embodiments of the disclosure. For a person skilled in the art, various variations or modifications may be made based on the above illustration. Here, it is unnecessary and unable to exhaust all the embodiments. All the apparent variations or modifications explicated thereby will fall into the protection scope of the disclosure.

What is claimed is:

1. A packaging method with films, with the steps comprising:
   step 1, placing a device to be packaged in a plasma-enhanced chemical vapor deposition device, and setting a mask plate to expose a packaging region of the device to be packaged and mask a region of the device to be packaged that does not need to be packaged;
   step 2, adjusting $SiH_4$ and $NH_3$ gases that are passed into the plasma-enhanced chemical vapor deposition device, and depositing and growing a layer of inorganic $SiN_x$ film; and
   step 3, adjusting $N_2$ gas that is passed into the plasma-enhanced chemical vapor deposition device, and depositing a layer of organosilane film on the layer of inorganic $SiN_x$ film using a chlorine atom-containing organic aliphatic silane that reacts with the layer of inorganic $SiN_x$ film.

2. The method according to claim 1, wherein the $SiH_4$ gas is diluted by helium gas or argon gas so that its volume concentration is in the range of 5% to 30%.

3. The method according to claim 1, wherein the method further comprises a step 4) including: repeating steps 2) and 3).

4. The method according to claim 3, wherein after the step 4), the method further comprises a step 5) including:
   adjusting $O_2$ gas that is passed into the plasma-enhanced chemical vapor deposition device, and depositing a layer of hexamethyldisiloxane film on the layer of organosilane film using an organosilicon precursor.

5. The method according to claim 4, comprising:
   repeating steps 2), 3) and 5); or
   performing step 5) after repeating steps 2) and 3) several times.

6. A film package structure, which consists of at least one layer of inorganic silicon material films and at least one layer of organosilane films that are set alternately, wherein the organosilane films is bonded with the inorganic silicon material films via chemical bonds, wherein the inorganic silicon material is SiNx, and an organic material for forming the layer of organosilane films is a chlorine atom-containing organic aliphatic silane.

7. The film package structure according to claim 6, wherein the chlorine atom-containing organic aliphatic silane is one selected from octadecyltrichlorosilane, eicosyltrichlorosilane, tetradecyltrichlorosilane and hexadecyltrichlorosilane.

8. The film package structure according to claim 6, wherein a thickness of one layer of the inorganic silicon material films is in the range of 20 to 2000 nm, and the number of layers of the inorganic silicon material films is in the range of 1 to 10.

9. The film package structure according to claim 6, wherein a thickness of one layer of the organosilane films is in the range of 100 to 2000 nm, and the number of layers of the organosilane films is in the range of 1 to 10.

10. The film package structure according to claim 6, wherein a layer of hexamethyldisiloxane film is further deposited on the layer of organosilane films.

11. The film package structure according to claim 10, wherein a thickness of one layer of hexamethyldisiloxane films is in the range of 100 to 2000 nm, and the number of layers of hexamethyldisiloxane films is in the range of 1 to 8.

12. A display device, comprising the film package structure according to claim 6.

13. The film package structure according to claim 8, wherein a thickness of one layer of the organosilane films is in the range of 100 to 2000 nm, and the number of layers of the organosilane films is in the range of 1 to 10.

14. The display device according to claim 12, wherein a thickness of one layer of the inorganic silicon material films is in the range of 20 to 2000 nm, and the number of layers of the inorganic silicon material films is in the range of 1 to 10.

15. The display device according to claim 12, wherein a thickness of one layer of the organosilane films is in the range of 100 to 2000 nm, and the number of layers of the organosilane films is in the range of 1 to 10.

* * * * *